US010763316B2

(12) United States Patent
Han et al.

(10) Patent No.: US 10,763,316 B2
(45) Date of Patent: Sep. 1, 2020

(54) ORGANIC LIGHT EMITTING DIODE DISPLAY DEVICE

(71) Applicant: LG Display Co., Ltd, Seoul (KR)

(72) Inventors: Ji-Su Han, Paju-si (KR); Hye-Jeong Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/219,574

(22) Filed: Dec. 13, 2018

(65) Prior Publication Data

US 2019/0198583 A1 Jun. 27, 2019

(30) Foreign Application Priority Data

Dec. 27, 2017 (KR) ........................ 10-2017-0180403

(51) Int. Cl.

*H01L 29/08* (2006.01)
*H01L 27/32* (2006.01)
*H01L 51/52* (2006.01)
*G02B 5/30* (2006.01)

(52) U.S. Cl.

CPC ........ *H01L 27/3232* (2013.01); *G02B 5/3016* (2013.01); *G02B 5/3083* (2013.01); *H01L 27/3211* (2013.01); *H01L 51/5206* (2013.01); *H01L 51/5271* (2013.01); *H01L 51/5281* (2013.01); *H01L 27/3244* (2013.01); *H01L 51/5256* (2013.01); *H01L 2251/5369* (2013.01)

(58) Field of Classification Search

CPC .......................... H01L 27/3232; H01L 27/3211
See application file for complete search history.

(56) References Cited

U.S. PATENT DOCUMENTS 6,965,420 B2 * 11/2005 Li .......................... B82Y 15/00 349/115
2011/0092718 A1 * 4/2011 Enger .................. C07D 493/04 549/464
2018/0136518 A1 * 5/2018 Min ...................... G02F 1/1347
2018/0299603 A1 * 10/2018 Lee ..................... H01L 51/0097
2018/0301656 A1 * 10/2018 Ji ........................ H01L 51/5209
2019/0317352 A1 * 10/2019 Saitoh .................... C09K 19/38

* cited by examiner

*Primary Examiner* — Allen L Parker
*Assistant Examiner* — Wasiul Haider
(74) *Attorney, Agent, or Firm* — Birch, Stewart, Kolasch & Birch, LLP

(57) ABSTRACT

An organic light emitting diode display device includes a substrate including a red pixel region, a green pixel region, and a blue pixel region; a driving thin film transistor and a light emitting diode which are in each of the red pixel region, the green pixel region, and the blue pixel region; and a cholesteric liquid crystal (CLC) layer having an infrared radiation (IR) wavelength in a transmission direction of light emitted from the light emitting diode, wherein the IR wavelength is in a range of 800 nm to 1,100 nm, and the CLC layer has a reflection wavelength of 400 nm to 700 nm at a viewing angle of 40° to 60°.

10 Claims, 12 Drawing Sheets

P
100
R-SP
G-SP
B-SP
TrA
EA
120
E
115 113 111
118
119
116
107
116
110a
110b
DTr
103b 103a 103c
103
105
109a 109b
101
131a
200
131c
130
133
131b
135

ORGANIC LIGHT EMITTING DIODE DISPLAY DEVICE

CROSS-REFERENCE TO RELATED APPLICATIONS

The present application claims the priority from and the benefit of Korean Patent Application No. 10-2017-0180403 filed in Republic of Korea on Dec. 27, 2017, which is hereby incorporated by reference in its entirety for all purposes as if fully set forth herein.

BACKGROUND

Field of Invention

The present invention relates to an organic light emitting diode display device, and more particularly, to an organic light emitting diode display device in which a color shift phenomenon according to an increase in a viewing angle is reduced.

Discussion of the Related Art

Recently, with the advent of an information-oriented society, as interest in information displays for processing and displaying a massive amount of information and a demand for portable information media have increased, a display field has rapidly advanced. Thus, various light and thin flat panel display devices have been developed and highlighted.

As examples of the flat display devices, there are a liquid crystal display (LCD) device, a plasma display panel (PDP) device, a field emission display (FED) device, an electroluminescence display (ELD) device, an organic light emitting diode (OLED) display device, and the like. The flat display devices exhibit excellent characteristics in tetras of thinning, lightening, and reductions in the power consumption thereof and thus have rapidly replaced the conventional cathode ray tube (CRT) displays.

Among the flat panel display devices, the OLED display device is a self-luminescent type device and does not require a backlight unit used in the LCD device as a non-self luminescent type device. As a result, the OLED display device can be lightweight and thin.

In addition, the OLED display device has advantages of a viewing angle, a contrast ratio, and power consumption as compared with the LCD device. Furthermore, the OLED display device can be driven with a low direct current (DC) voltage and has a rapid response speed. Moreover, since inner elements of the OLED display device are in a solid state, the OLED display device has high durability against an external impact and has a wide available temperature range.

Specifically, since the OLED display device is manufactured through a simple process, manufacturing costs can be saved more than the conventional LCD device.

The OLED display device can be classified into a passive matrix type and an active matrix type. In the passive matrix type, scan lines and signal lines cross each other to form elements in a matrix form. In the active matrix type, a thin film transistor, which is a switching element configured to turn a pixel region on/off, is disposed for each of pixel regions.

Since a passive matrix type OLED display device has many limiting factors in resolution, power consumption, and lifetime, research has been actively conducted on an active matrix type OLED display device capable of implementing a high resolution and a large screen.

FIG. 1 is a schematic cross-sectional view illustrating an active matrix type OLED display device according to the related art, and the OLED display device is a bottom emission type.

As shown, in an OLED display device 10, a substrate 1, on which driving thin film transistors DTr and light emitting diodes (LED) 14 are formed, is encapsulated by a protective film 12.

More specifically, the driving thin film transistor DTr is formed in each of pixel regions SP on the substrate 1. A first electrode 11 is connected to the driving thin film transistor DTr. An organic light emitting layer 13 for emitting specific color light is formed on the first electrode 11. A second electrode 15 is formed on the organic light emitting layer 13.

The first and second electrodes 11 and 15 and the organic light emitting layer 13 formed between the first electrode 11 and the second electrode 15 constitute the LED 14. In this case, the first electrode 11 serves as an anode, and the second electrode 15 serves as a cathode.

The protective film 12 in the form of a thin film is formed on the driving thin film transistor DTr and the LED 14 so that the OLED display device 10 is encapsulated through the protective film 12.

The OLED display device 10 has a disadvantage in that a contrast is considerably reduced according to the intensity of external light. Therefore, in order to prevent the contrast from being degraded due to the external light, a polarizer 20 configured to block reflection of the external light is attached onto a surface of the substrate 1 where light is emitted.

In other words, in the OLED display device 10, the polarizer 20 configured to block the external light incident from the outside is disposed in a transmission direction of light emitted from the organic light emitting layer 13, thereby improving the contrast.

In the OLED display device 10, while the light emitted from the organic light emitting layer 13 passes through various components and is emitted to the outside, a large portion of the light is lost. Thus, light emitted to the outside is only about 20% of the light produced from the organic light emitting layer 13.

Since the amount of the light emitted from the organic light emitting layer 13 is increased in proportion to the amount of a current applied to the OLED display device 10, it is possible to further increase brightness of the OLED display device 10 by applying a higher current to the organic light emitting layer 13. However, in this case, power consumption is increased, and the lifetime of the OLED display device 10 is also reduced.

Therefore, recently, in order to improve the luminance efficiency of the OLED display device 10, research for implementing a micro cavity effect has been actively carried out. The micro cavity effect increases a front luminance, but a color shift phenomenon, in which light is shifted from a long wavelength to a short wavelength, occurs when viewed from the side.

FIG. 2 is a graph showing a luminance distribution according to a viewing angle, in which a horizontal axis represents the viewing angle and a vertical axis represents a color difference (Δu'v' in an arbitrary unit (a.u.)) with respect to a color when viewed from the front of the display device.

The color difference with respect to the color when viewed from the front of the display device is a numerical value representing a difference between a color of light at the viewing angle and a color of light emitted from an LED E. In other words, a color difference at each of various viewing angles with respect to each of the red, green, blue, and white colors at an angle of 0° is converted into a Δu'v' value.

Referring to FIG. 2, it is seen that a change rate of the emission intensity of the blue color is rapidly increased when a viewing angle is changed from 0° to 60°. This is because a color shift phenomenon, in which light shifts from a long wavelength to a short wavelength, occurs as the viewing angle is increased.

Thus, a color shift phenomenon in which an image on the OLED display device 10 appears bluish occurs when viewed from the side as compared with when viewed from the front of the OLED display device 10.

A color difference is great according to a viewing direction and angle in which a user views the OLED display device 10, and the difference acts as a factor to reduce quality of an actual product.

SUMMARY

Accordingly, the present invention is directed to an organic light emitting diode display (OLED) device that substantially obviates one or more of the problems due to limitations and disadvantages of the related art.

An object of the present invention is to provide an OLED display device that can prevent degradation of image quality due to an increase in a viewing angle.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes a substrate including a red pixel region, a green pixel region, and a blue pixel region; a driving thin film transistor and a light emitting diode which are in each of the red pixel region, the green pixel region, and the blue pixel region; and a cholesteric liquid crystal (CLC) layer having an infrared radiation (IR) wavelength in a transmission direction of light emitted from the light emitting diode, wherein the IR wavelength is in a range of 800 nm to 1,100 nm, and the CLC layer has a reflection wavelength of 400 nm to 700 nm at a viewing angle of 40° to 60°.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention, are incorporated in and constitute a part of this specification, illustrate implementations of the disclosure and together with the description serve to explain the principles of embodiments of the invention.

DETAILED DESCRIPTION

Reference will now be made in detail to exemplary embodiments, examples of which are illustrated in the accompanying drawings. The same reference numbers can be used throughout the drawings to refer to the same or like parts.

Figure 3:
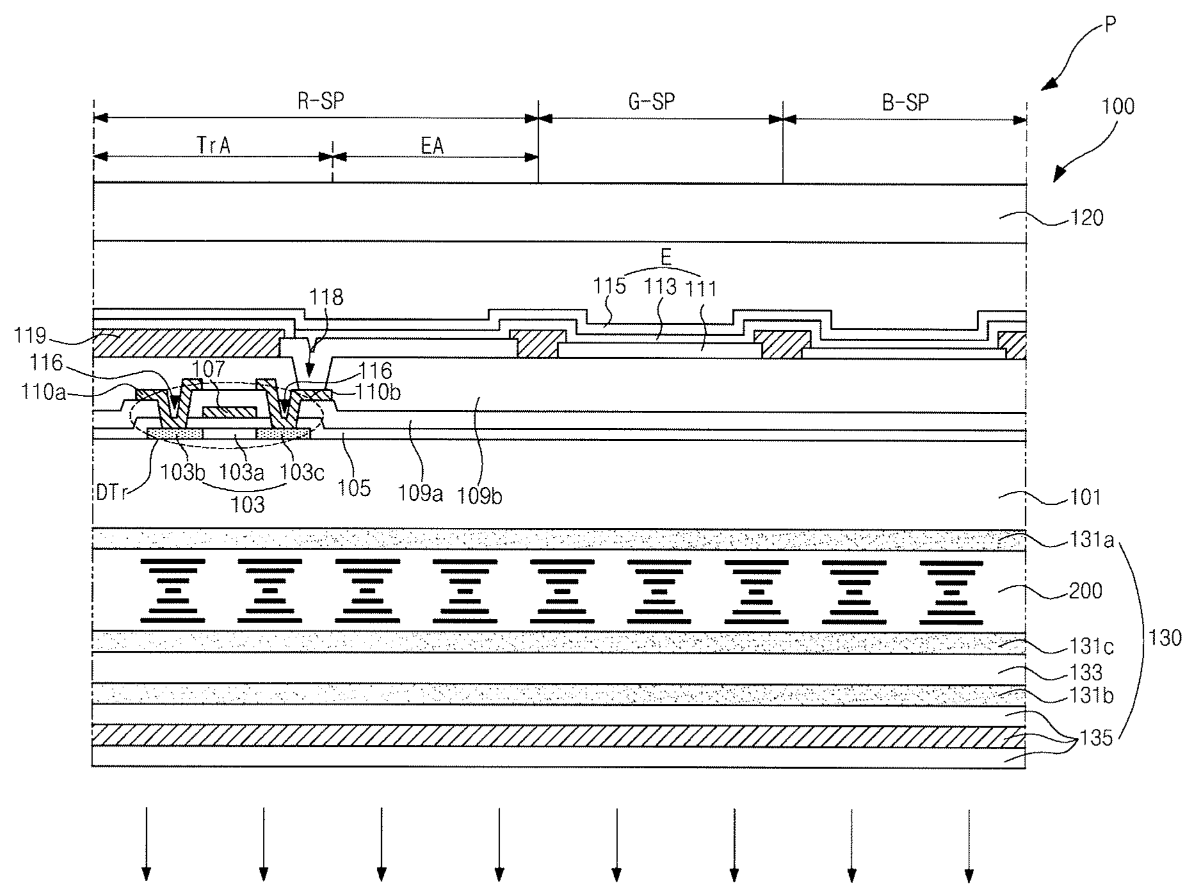
FIG. 3 is a schematic cross-sectional view illustrating an OLED display device according to an embodiment of the present invention.

FIG. 3 is a schematic cross-sectional view illustrating an organic light emitting diode display (OLED) device according to an embodiment of the present invention. All the components of the OLED display device according to all embodiments of the present invention are operatively coupled and configured.

Referring to FIG. 3, in an OLED display device 100 according to the embodiment of the present invention, a driving thin film transistor DTr is disposed in each of pixel regions R-SP, G-SP, and B-SP. For convenience of description and simplicity of the drawings, the driving thin film transistor DTr is shown only in the red pixel region R-SP as an example.

The OLED display device 100 according to the embodiment of the present invention is divided into a top emission type and a bottom emission type according to a light transmission direction. Hereinafter, the bottom emission type will be described as an example in the present invention.

In addition, for convenience of description, a region in which the driving thin film transistor DTr is formed can be defined as a switching region TrA, and a region in which a light emitting diode (LED) E is formed can be defined as an emission region EA.

In the OLED display device 100 according to the embodiment of the present invention, a substrate 101, on which the driving thin film transistor DTr and the LED E are formed, is encapsulated by a protective film 120.

More specifically, a semiconductor layer 103 is disposed in the switching region TrA of each of the pixel regions R-SP, G-SP, and B-SP on the substrate 101. The semiconductor layer 103 is made of silicon and has an active region 103*a* serving as a channel and disposed at a central portion thereof, and a source region 103*b* and a drain region 103*c* which are doped with high concentration impurities and are disposed at both sides of the active region 103*a*.

A gate insulating layer 105 is disposed on the semiconductor layer 103. A gate electrode 107 corresponding to the active region 103*a* of the semiconductor layer 103 and a gate line extending in one direction are provided on the gate insulating layer 105.

In addition, a first interlayer insulating layer 109*a* is disposed on the gate electrode 107 and the gate line. In this case, the first interlayer insulating layer 109*a* and the gate insulating layer 105 below the first interlayer insulating layer 109*a* have first and second semiconductor layer contact holes 116 configured to respectively expose the source and drain regions 103*b* and 103*c*.

Source and drain electrodes 110*a* and 110*b* are spaced apart from each other on the first interlayer insulating layer 109*a* and are respectively in contact with the source and drain regions 103*b* and 103*c* exposed through the first and second semiconductor layer contact holes 116.

A second interlayer insulating layer 109*b* is disposed on the first interlayer insulating layer 109*a* and the source electrode 110*a* and the drain electrode 110*b*.

In this case, the source and drain electrodes 110*a* and 110*b*, the semiconductor layer 103, the gate insulating layer 105, and the gate electrode 107 constitute the driving thin film transistor DTr.

Data lines are provided to cross the gate lines and define the pixel regions R-SP, G-SP, and B-SP. A switching thin film transistor can have the same structure as the driving thin film transistor DTr and is connected to the driving thin film transistor DTr.

In this embodiment, the driving thin film transistor DTr having a top gate structure with the semiconductor layer 103 formed as a polycrystalline silicon layer or oxide semiconductor layer is described by way of example. Alternatively, the driving thin film transistor DTr can have a bottom gate structure with the semiconductor layer 103 formed as an amorphous silicon layer.

When the semiconductor layer 103 is formed as the oxide semiconductor layer, a light shielding layer can be disposed below the semiconductor layer 103. A buffer layer can be disposed between the light shielding layer and the semiconductor layer 103.

The second interlayer insulating layer 109*b* has a drain contact hole 118 configured to expose the drain electrode 110*b*. A first electrode 111 is disposed on the second interlayer insulating layer 109*b*. The first electrode 111 is connected to the drain electrode 110*b* of the driving thin film transistor DTr and is made of, for example, a material having a relatively high work function to constitute an anode of the LED E.

The first electrode 111 can be made of a metal oxide such as indium tin oxide (ITO) or indium zinc oxide (IZO), a mixture of a metal and an oxide such as ZnO:Al or $SnO_2$:Sb, or a conductive polymer such as poly(3-methylthiophene), poly[3,4-(ethylene-1,2-dioxy)thiophene] (PEDT), polypyrrole, or polyaniline. Alternatively, the first electrode 111 can be made of carbon nano tubes (CNTs), graphene, silver nano wires, or the like.

The first electrode 111 is disposed in each of the pixel regions R-SP, G-SP, and B-SP. A bank 119 is disposed between the first electrodes 111 of the pixel regions R-SP, G-SP, and B-SP. In other words, the bank 119 is disposed along an edge of each pixel region P. The first electrodes 111 are separate from each other with the bank 119 as a boundary portion of each pixel region.

An organic light emitting layer 113 is disposed on the first electrode 111. The organic light emitting layer 113 can include a single layer made of an emitting material. In order to improve luminous efficiency, the organic light emitting layer 113 can include multi layers that have a hole injection layer, a hole transport layer, an emitting material layer, an electron transport layer, and an electron injection layer.

A second electrode 115, which serves as a cathode, is entirely disposed on the organic light emitting layer 113.

The second electrode 115 can be made of a material having a relatively low work function. The second electrode 115 can be formed with a single layer or multiple layers using a first metal such as Ag and a second metal such as Mg, and the single layer can be made of an alloy of the first and second metals at a predetermined ratio thereof.

In the OLED display device 100, when predetermined voltages are applied to the first electrode 111 and the second electrode 115, holes injected from the first electrode 111 and electrons injected from the second electrode 115 are transported to the organic light emitting layer 113 to form excitons. When the excitons are transitioned from an excited state to a ground state, light is generated and emitted in the form of visible light.

The OLED display device 100 according to the embodiment of the present invention is a bottom emission type in which light emitted from the organic light emitting layer 113 is output to the outside through the first electrode 111. In this case, the OLED display device 100 can further include a reflective layer made of an opaque conductive material. In an example, the reflective layer can be made of an aluminum-palladium-copper (APC) alloy, and the second electrode 115 can have a triple-layered structure of ITO/APC/ITO.

In addition, the first electrode 111 can be made of a semi-transmissive conductive material such as magnesium (Mg), silver (Ag), or an alloy of magnesium (Mg) and silver (Ag). When the first electrode 111 is made of the semi-transmissive conductive material, luminous efficiency can be improved due to a micro cavity.

In the LED E according to the embodiment of the present invention, a distance between the first electrode 111 and the second electrode 115 differs for each of the pixels regions R-SP, G-SP, and B-SP to implement a micro cavity effect.

The micro cavity effect is a phenomenon in which lights reflected between mirrors are destructively or constructively interfered with each other, only a light having a specific wavelength remains and a light having other wavelengths is cancelled, thereby increasing intensity of a light having a specific wavelength.

In order to implement the micro cavity effect, a depth or a length of a micro cavity between the first electrode 111 and the second electrode 115 or between the first and second electrodes 111 and 115 and an emitting material layer of the organic light emitting layer 113 is formed in each of the pixel regions R-SP, G-SP, and B-SP such that a resonant wavelength corresponding to a desired color peak wavelength is secured.

More specifically, in the OLED display device 100 according to the present application, one unit pixel P can include adjacent red, green, and blue pixel regions R-SP, G-SP, and B-SP. An effective depth of a micro cavity can be defined by an optical distance, i.e., a wavelength. Since a wavelength of red light is longer than a wavelength of green light, a depth of a micro cavity for the red pixel region R-SP can be greater than a depth of a micro cavity for the green pixel region G-SP.

Since a wavelength of green light is longer than a wavelength of blue light, a depth of a micro cavity for the green pixel region G-SP is greater than a depth of a micro cavity for the blue pixel region B-SP.

In order to implement a micro cavity effect, the red, green, and blue pixel regions R-SP, G-SP, and B-SP can satisfy Expression 1 below:

$$nd=(2m-1)\lambda(m=1,2,\ldots) \quad \text{(Expression 1)}$$

In Expression 1, n can be a refractive index of the emitting material layer (EML) of the organic light emitting layer 113, d can be a distance between the first electrode 111 and the second electrode 115, m is a constant, and λ is a desired central wavelength.

Therefore, in an example, the first electrode 111 of the red pixel region R-SP can be formed to have a first thickness, the first electrode 111 of the green pixel region G-SP can be formed to have a second thickness less than the first thickness, and the first electrode 111 of the blue pixel region B-SP can be formed to have a third thickness less than the second thickness.

Due to the first electrodes 111 formed to have thicknesses which differ for each of the red, green, and blue pixel regions R-SP, G-SP, and B-SP, a distance from the first electrode 111 of the red pixel region R-SP to the second electrode 115 thereof can be the longest distance, a distance from the first electrode 111 of the blue pixel region B-SP to the second electrode 115 thereof can be the shortest distance, and a distance from the first electrode 111 of the green pixel region G-SP to the second electrode 115 thereof can be a middle distance (e.g., between the longest and shortest distances).

In other words, a depth of a micro cavity of the red pixel region R-SP can be the longest depth, a depth of a micro cavity of the blue pixel region B-SP can be the shortest depth, and a depth of a micro cavity of the green pixel region G-SP can be a middle depth.

Therefore, since emitted light is constructively interfered in each of the pixel regions R-SP, G-SP, and B-SP, luminous efficiency can be optimized in each of the pixel regions R-SP, G-SP, and B-SP, thereby reducing power consumption.

The protective film 120 in the form of a thin film is formed on the driving thin film transistor DTr and the LED E so that the OLED display device 100 is encapsulated through the protective film 120.

In order to prevent external oxygen and moisture from permeating into the OLED display device 100, the protective film 120 includes at least two stacked inorganic protective films. In this case, an organic protective film can be interposed between the two inorganic protective films to compensate for impact resistance of the inorganic protective films.

In such a structure in which the organic protective film and the inorganic protective film alternately and repeatedly are stacked, in order to prevent moisture and oxygen from permeating through side surfaces of the organic protective film, the inorganic protective films can completely cover the organic protective film.

Accordingly, the OLED display device 100 can prevent moisture and oxygen from permeating into the OLED display device 100 from the outside.

Therefore, it is possible to prevent an electrode layer from being oxidized and corroded by oxygen and moisture introduced into the OLED display device 100, thereby preventing degradation of emission characteristics and lifetime reduction of the organic light emitting layer 113.

In addition, it is possible to prevent current leakage and a short circuit, thereby preventing pixel defects. As a result, non-uniform characteristics of brightness or image are prevented from being generated.

In the OLED display device 100 according to the embodiment of the present invention, a polarizer 130 is disposed on an outer surface of the substrate 101, where light is output, to prevent degradation of contrast caused by external light.

In other words, since the polarizer 130 is disposed in a transmission direction of light emitted from the organic light emitting layer 113 to block external light incident from the outside, contrast is improved when the OLED display device 100 is in a driving mode for displaying an image.

A first adhesive layer 131*a*, which is transparent and has an adhesive property, can be interposed between the polarizer 130 and the substrate 101.

The polarizer 130 is a circular polarizer configured to block external light and includes a phase retardation plate 133 attached to the outer surface of the substrate 101 and a linear polarizing plate 135. The linear polarizing plate 135 and the phase retardation plate 133 are attached to each other with a second adhesive layer 131*b* interposed between the linear polarizing plate 135 and the phase retardation plate 133.

In this case, the linear polarizing plate 135 and the phase retardation plate 133 can be stacked in an order in which the linear polarizing plate 135 is disposed close to an incident direction of external light and the phase retardation plate 133 is disposed inward from the linear polarizing plate 135.

The phase retardation plate 133 can be provided as a quarter wave plate (QWP) having a phase retardation value of λ/4.

The linear polarizing plate 135 has a polarization axis and linearly polarizes light in a direction of the polarization axis. Specifically, the linear polarizing plate 135 transmits light which coincides with the polarization axis and absorbs light which does not coincide with the polarization axis. Therefore, when light passes through the linear polarizing plate 135, the light is linearly polarized in the direction of the polarization axis.

A surface treatment layer can be further provided on an outer side of the linear polarizing plate 135. The surface treatment layer can be an anti-glare layer including silica beads or a hard coating layer configured to prevent damage to a surface of the linear polarizing plate 135.

As a result, the OLED display device 100 can prevent degradation of contrast by minimizing reflection of external light through the circular polarizer 130.

In particular, in the OLED display device 100 according to the embodiment of the present invention, a cholesteric liquid crystal (CLC) layer 200 having an infrared radiation (IR) wavelength can be disposed between the phase retardation plate 133 and the substrate 101.

In other words, a third adhesive layer 131*c* is interposed between the phase retardation plate 133 and the CLC layer 200, and the first adhesive layer 131*a* is interposed between the CLC layer 200 and the substrate 101.

The CLC layer 200 has an IR wavelength and thus selectively reflects light having a specific wavelength band. In other words, among light which passes through the substrate 101 and is incident on the CLC layer 200, light in an IR wavelength region, which is incident on the front of the CLC layer 200, can be transmitted, and light in a reflection wavelength region according to a viewing angle can be selectively reflected and recycled. For example, regarding the light which passes through the substrate 101 and is incident on the CLC layer 200, only light in a selectively designed wavelength region among light traveling at a viewing angle can be reflected, and the reflected light can be reflected again by components between the substrate 101 and the CLC layer 200 and be thus recycled in a lateral direction of the OLED display device 100 and output.

Therefore, a color shift phenomenon, in which light is shifted from a long wavelength to a short wavelength according to an increase in a viewing angle, can be compensated through light output in the lateral direction of the OLED display device 100.

This will be described in more detail with reference to FIGS. 4A, 4B, 5A and 5B.

FIGS. 4A, 4B, 5A and 5B are schematic views illustrating liquid crystal molecules of the CLC layer according to the embodiment of the present invention.

Referring to FIGS. 4A-5B, the CLC layer 200 (e.g., see FIG. 3) has a spiral structure in which optical axes of liquid crystal molecules 210 and 220 are oriented to be twisted along a spiral axis.

Figure 4A:
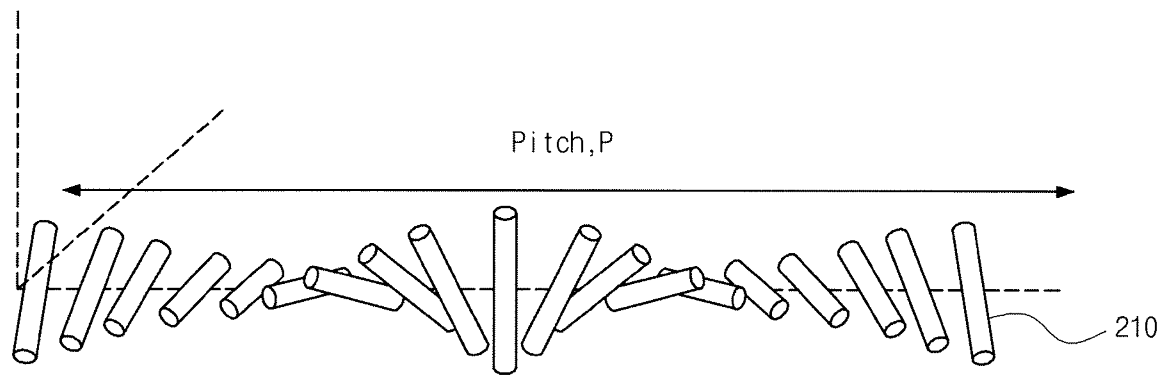
FIGS. 4A and 4B and FIGS. 5A and 5B are schematic views illustrating liquid crystal molecules of a cholesteric liquid crystal (CLC) layer according to an embodiment of the present invention.
Figure 4B:
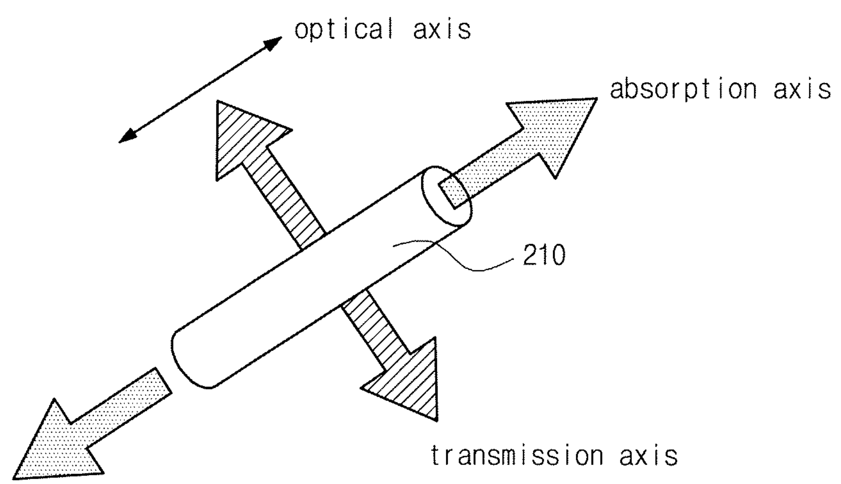
Figure 5A:
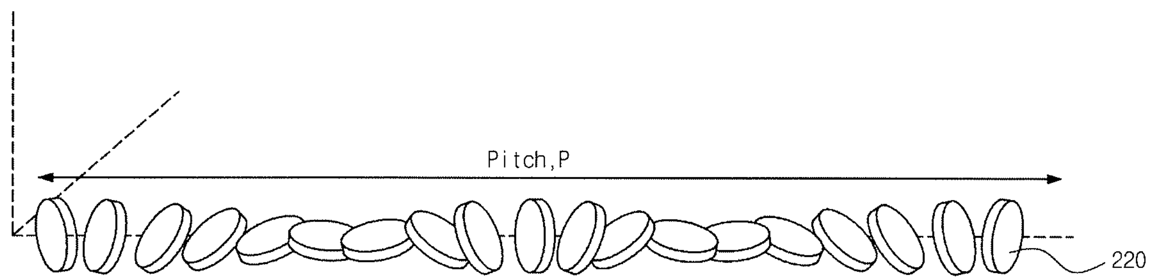
Figure 5B:
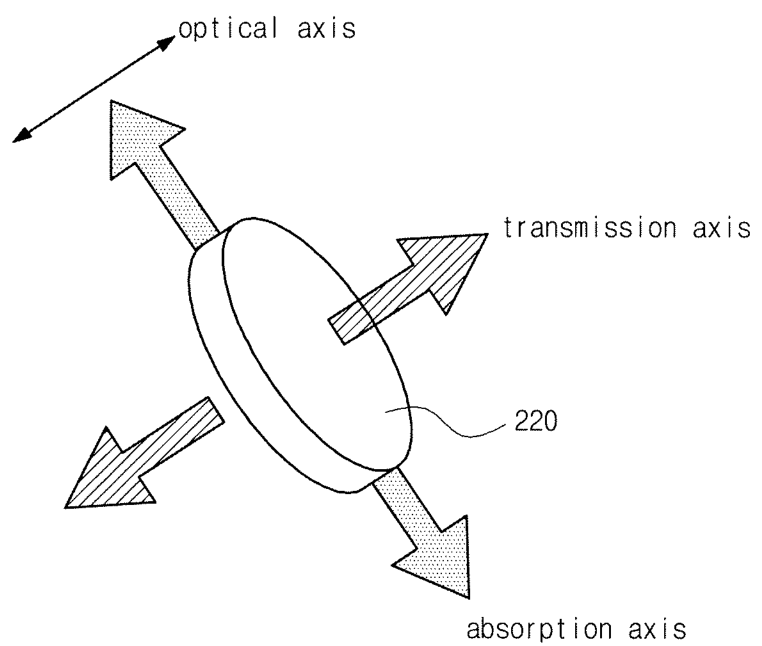

The liquid crystal molecules 210 and 220 of the CLC layer 200 (see FIG. 3) can have a rod shape or a discotic shape. As shown in FIGS. 4A and 4B, the optical axis of the liquid crystal molecule 210 with the rod shape corresponds to a long axis of the liquid crystal molecule 210 so that the optical axis is parallel to an absorption axis. As shown in FIGS. 5A to 5B, the optical axis of the liquid crystal molecule 220 with the discotic shape corresponds to an axis in a normal direction of a discotic plane so that the optical axis is perpendicular to the absorption axis.

In the CLC layer 200, when a distance until the optical axes of the liquid crystal molecules 210 and 220 rotate 360 degrees is defined as a pitch P, light is Bragg-reflected due to a repeating structure.

Generally, in a CLC, when a wavelength $\lambda$, is in a range of Expression 2 below with respect to light traveling along a spiral axis, Bragg reflection occurs.

$$NoP<\lambda<NeP \quad \text{(Expression 2)}$$

P is a pitch of the CLC, Ne is a refractive index of the CLC with respect to light polarized parallel to an optical axis of the CLC, and No is a refractive index of the CLC with respect to light polarized perpendicular to the optical axis of the CLC.

In addition, a central wavelength $\lambda_0$ of a wavelength region of light reflected by the CLC can be defined by Expression 3 below:

$$\lambda_0=0.5(No+Ne)P \quad \text{(Expression 3)}$$

Furthermore, a spectrum width $\Delta\lambda_0$ of the light reflected by the CLC can be defined by Expression 4 below:

$$\Delta\lambda_0=2\Delta\lambda_0(Ne-No)/(No+Ne)=P(Ne-No) \quad \text{(Expression 4)}$$

Such CLC layer can selectively transmit or reflect circularly polarized light. In other words, the CLC layer can selectively reflect or transmit right-circularly polarized light or left-circularly polarized light.

The OLED display device 100 (e.g., see FIG. 3) according to the embodiment of the present invention can adjust a reflection wavelength in a range of 800 nm to 1,100 nm through the pitch P of the CLC layer 200 (see FIG. 3).

Therefore, the OLED display device 100 (see FIG. 3) according to the embodiment of the present invention intactly transmits light in an IR wavelength region and selectively reflects light in a specific wavelength region according to a viewing angle among light incident on the CLC layer 200 (see FIG. 3).

The reflected light can be recycled and output in the lateral direction of the OLED display device 100 (see FIG. 3), and thus a color shift phenomenon, in which light is shifted from a long wavelength to a short wavelength according to an increase in a viewing angle, can be compensated through the light output in the lateral direction of the OLED display device 100.

Figure 6A:
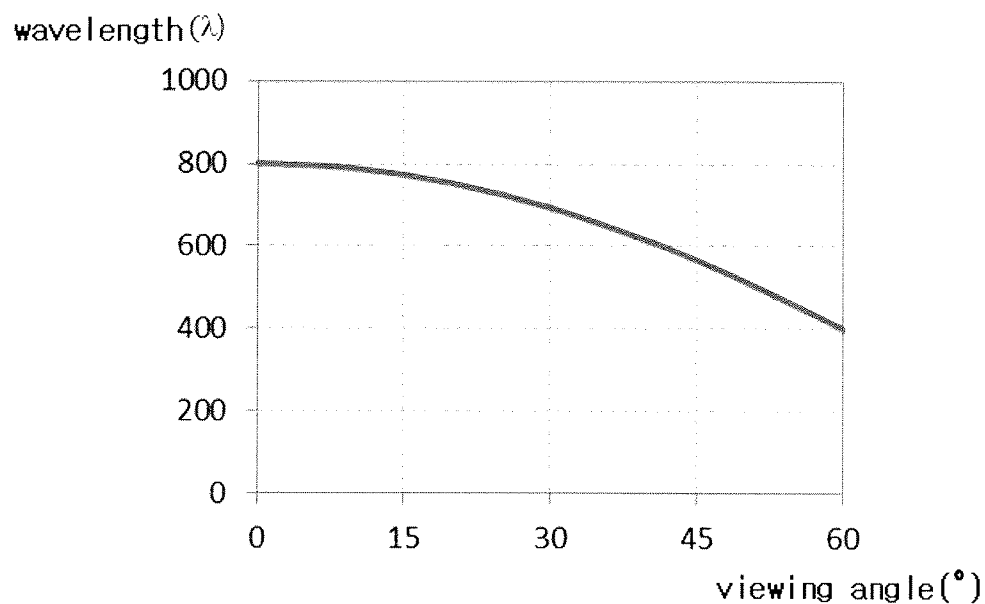
FIG. 6A is a graph showing a reflection wavelength according to a viewing angle of a CLC layer having a wavelength of 800 nm.
Figure 6B:
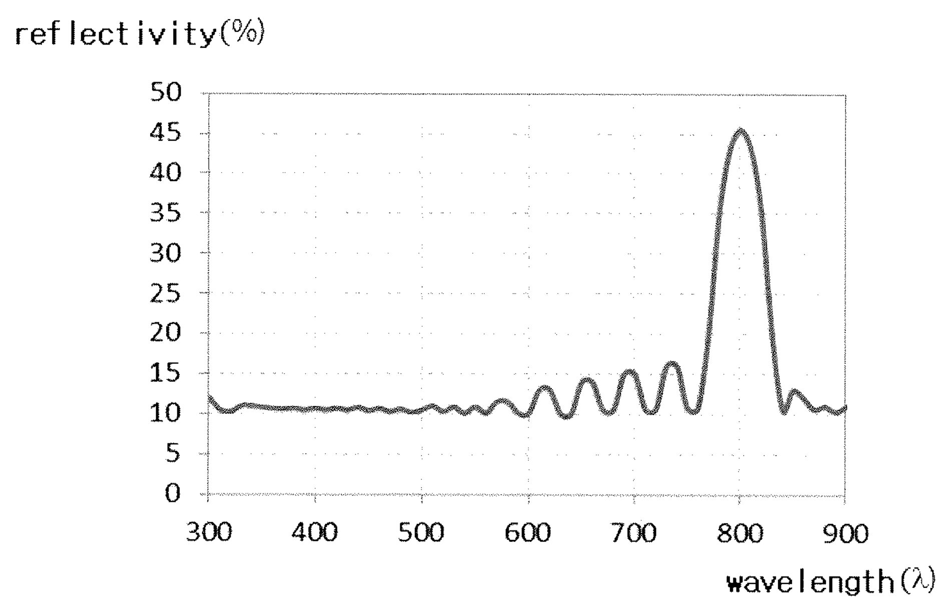
FIG. 6B is a graph showing reflectivity according to the reflection wavelength of FIG. 6A.

FIG. 6A is a graph showing a reflection wavelength according to a viewing angle of a CLC layer having a wavelength of 800 nm, and FIG. 6B is a graph showing reflectivity according to the reflection wavelength of FIG. 6A.

Figure 7A:
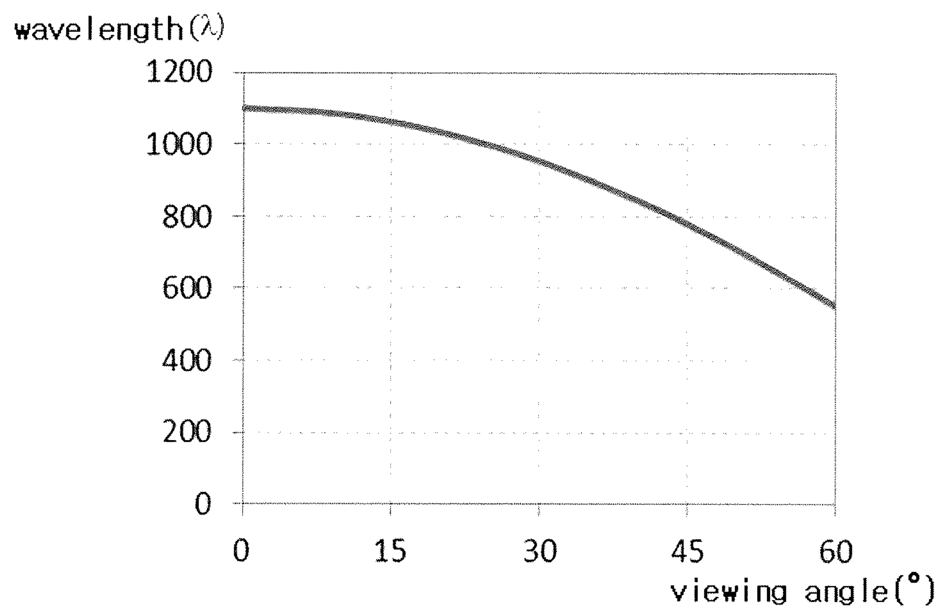
FIG. 7A is a graph showing a reflection wavelength according to a viewing angle of a CLC layer having a wavelength of 1,100 nm.
Figure 7B:
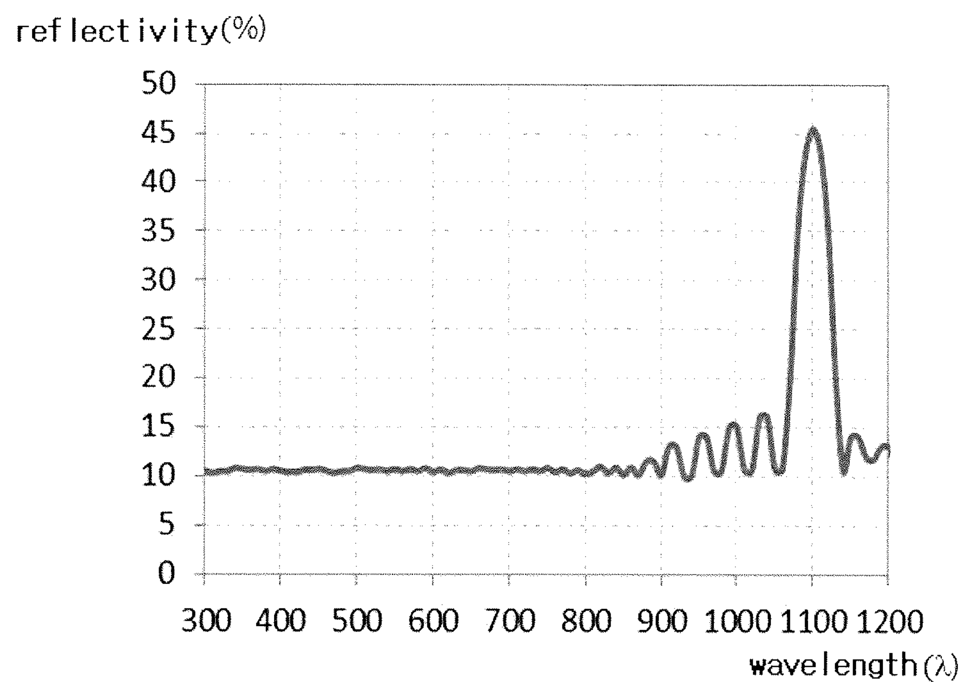
FIG. 7B is a graph showing reflectivity according to the reflection wavelength of FIG. 7A.

FIG. 7A is a graph showing a reflection wavelength according to a viewing angle of a CLC layer having a wavelength of 1,100 nm, and FIG. 7B is a graph showing reflectivity according to the reflection wavelength of FIG. 7A.

The CLC layers of FIGS. 6A to 7B have liquid crystal molecules with a rod shape.

As shown in FIG. 6A, in the CLC layer 200 (e.g., see FIG. 3) having a wavelength of 800 nm, it can be seen that as a viewing angle is increased, a wavelength region is decreased. Light in a wavelength region of 800 nm is reflected at a viewing angle of 0°, and light in a wavelength region of 400 nm is reflected at a viewing angle of 60°.

In this case, in the CLC layer 200 (see FIG. 3) having the wavelength of 800 nm, it can be seen that light having a wavelength of 760 nm to 840 nm has high reflectivity among light incident on the CLC layer 200.

In addition, as shown in FIG. 7A, in the CLC layer 200 (see FIG. 3) having the wavelength of 1,100 nm, it can be seen that as a viewing angle is increased, a wavelength region is also decreased. Light in a wavelength region of 1,100 nm is reflected at a viewing angle of 0°, and light in a wavelength region of 580 nm is reflected at a viewing angle of 60°.

In the CLC layer 200 (see FIG. 3) having the wavelength of 1,100 nm, it can be seen that light having a wavelength of 1,060 nm to 1,150 nm has high reflectivity among light incident on the CLC layer 200.

Referring to FIGS. 6A to 7B, it can be seen that the CLC layer 200 (see FIG. 3) can selectively reflect light having a wavelength of 400 nm to 1,150 nm. The CLC layer 200 can be designed taking into account that, when the CLC layer 200 selectively reflects light, a wavelength region of the reflected light can be changed according to a viewing angle.

In other words, in this embodiment, in order to prevent a color shift phenomenon in which an image of the OLED display device 100 appears bluish when viewed from the side of the OLED display device 100 as compared with when viewed from the front of the OLED display device 100, the CLC layer 200 (see FIG. 3) is formed to recycle light in a range from a green wavelength region to a red wavelength region and thus to output the recycled light in the lateral direction of the OLED display device 100 (see FIG. 3).

Light in the range of the green wavelength region to the red wavelength region, which is output in the lateral direction of the OLED display device 100 (see FIG. 3), in particular, the light in the red wavelength region, can compensate for a bluish appearing phenomenon.

The CLC layer 200 having the wavelength of 800 nm reflects light in a wavelength region of 400 nm to 800 nm according to a viewing angle, and the CLC layer 200 having the wavelength of 1,100 nm reflects light in a wavelength region of 580 nm to 1,100 nm according to a viewing angle.

In this case, in order to more reflect light having a red wavelength, the CLC layer 200 is designed to have a wavelength of 1,100 nm so as to implement a reflection wavelength of about 550 nm to about 800 nm at a viewing angle of 40° to 60°. In order to more reflect light having a green wavelength, the CLC layer 200 is designed to have a wavelength of 800 nm so as to implement a reflection wavelength of about 400 nm to 600 nm at a viewing angle of 40° to 60°.

As a result, a bluish appearing phenomenon can be reduced through light having a red wavelength.

Figure 8:
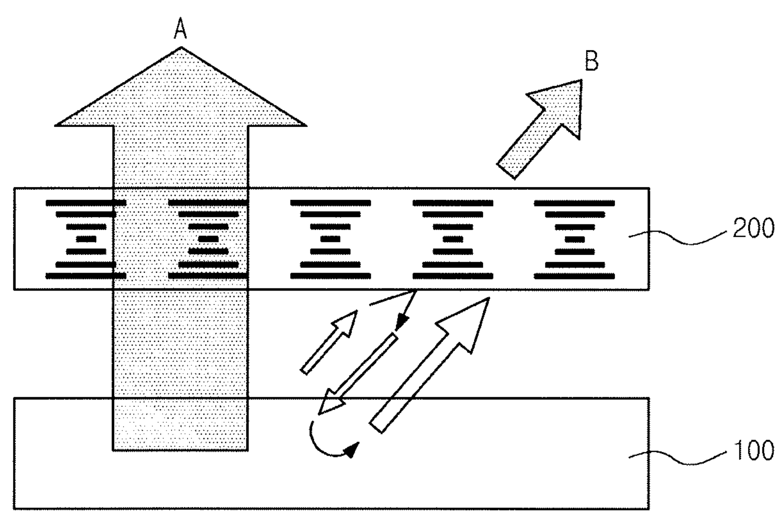
FIG. 8 is a schematic conceptual view illustrating a guide change of light when an OLED display device displaying an image according to an embodiment of the present invention.

FIG. 8 is a schematic conceptual view illustrating a guide change of light when the OLED display device according to the embodiment of the present invention implements an image.

In FIG. 8, for convenience of description, a guide change of light of the red pixel region (R-SP of FIG. 3) is schematically illustrated, and the CLC layer 200 has a wavelength of 1,100 nm.

As shown in FIG. 8, when predetermined voltages are applied to the first electrode 111 (see FIG. 3) and the second electrode 115 (see FIG. 3) of the LED E (see FIG. 3) in the OLED display device 100, red light A having various phases is emitted from the organic light emitting layer 113 (see FIG. 3).

The red light A emitted from the organic light emitting layer 113 intactly passes through the CLC layer 200 having the wavelength of 1,100 nm intact, thereby displaying an image.

On the contrary, red light, which is obliquely emitted in a lateral direction from the organic light emitting layer 113 and is incident on the CLC layer 200 at a specific viewing angle, is reflected by the CLC layer 200 and is incident inside the OLED display device 100 again.

The red light incident inside the OLED display device 100 again is reflected again by components inside the OLED display device 100 and is obliquely emitted again in a lateral direction at a certain inclination angle.

In this case, brightness of the light reflected and recycled by the CLC layer 200 is increased, and the recycled light is emitted in the lateral direction of the OLED display device 100. Thus, a color shift phenomenon, in which light is shifted from a long wavelength to a short wavelength according to an increase in a viewing angle, can be compensated through the light output in the lateral direction of the OLED display device 100.

Figure 9:
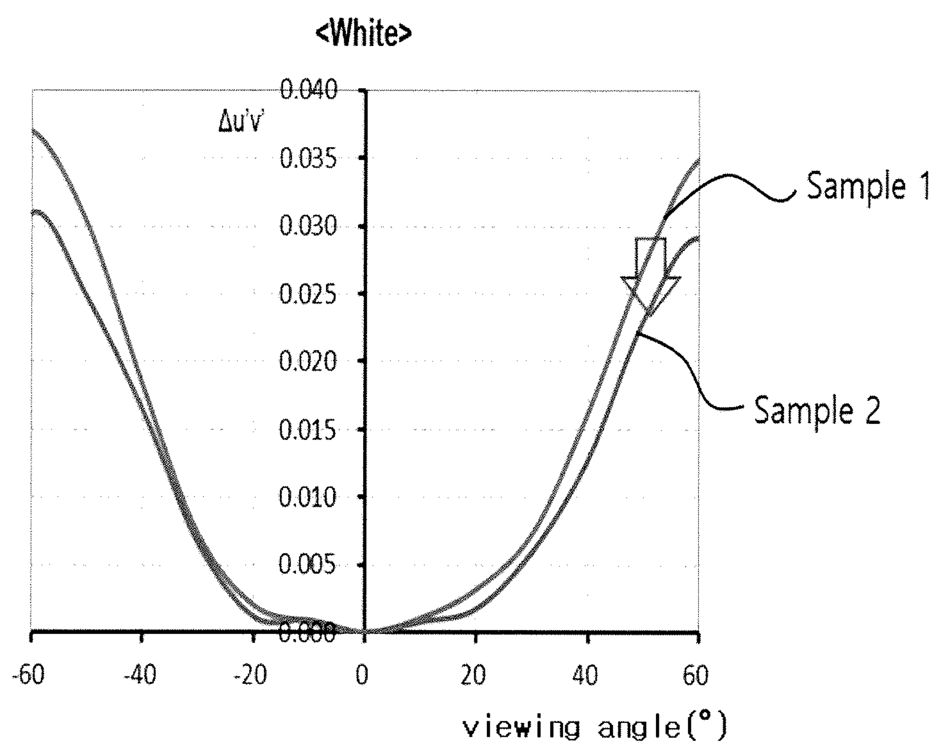
FIG. 9 is a graph showing a comparison between brightness distributions according to a viewing angle for the related art OLED display device and an OLED display device according to an embodiment of the present invention.

FIG. 9 is a graph showing a comparison between brightness distributions according to a viewing angle for a related art OLED display device and the OLED display device according to the embodiment of the present invention.

A horizontal axis represents a viewing angle, and a vertical axis represents a color difference (Δu'v' in an arbitrary unit (a.u.)) with respect to a color when viewed from the front.

The color difference with respect to the color when viewed from the front is a numerical value representing a difference between a color of light at a viewing angle and a color of light emitted from the LED E (see FIG. 3). In other words, a color difference at each of various viewing angles with respect to each of the red, green, blue, and white colors at an angle of 0° is converted into a Δu'v' value.

FIG. 9 shows a color difference of a white color measured with respect to a front. Sample 1 represents the related art OLED display device, and Sample 2 represents the OLED display device including the CLC layer 200 according to the embodiment of the present invention.

The CLC layer 200 (see FIG. 8) can include the liquid crystal molecules 210 (see FIG. 4B) with the rod shape.

Referring to FIG. 9, in Sample 1, it can be seen that a change rate of emission intensity of a white color is rapidly increased as a viewing angle is changed from 0° to 60°. In Sample 2, it can be seen that a change rate of emission intensity is decreased compared to Sample 1.

As described above, in the OLED display device 100 (see FIG. 8) according to the embodiment of the present invention, since the CLC layer 200 (see FIG. 8) is interposed between the substrate 101 (see FIG. 3) and the phase retardation plate 133 (see FIG. 3), among light which is output from the substrate 101 and is incident on the CLC layer 200, some light in a specific wavelength region according to a viewing angle is reflected and recycled according to a wavelength of the CLC layer 200.

The recycled light can be output in the lateral direction of the OLED display device 100 (see FIG. 8), and thus a color shift phenomenon, in which light is shifted from a long wavelength to a short wavelength according to an increase in a viewing angle, can be compensated through the light output in the lateral direction of the OLED display device 100.

As a result, a bluish appearing phenomenon at a side viewing angle is reduced or prevented.

Figure 1:
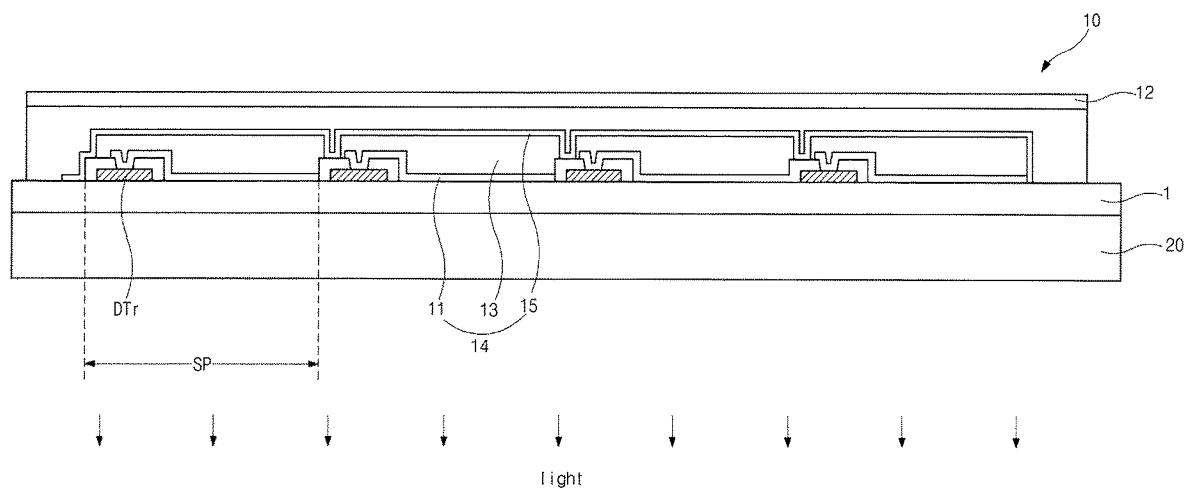
FIG. 1 is a schematic cross-sectional view illustrating an active matrix type organic light emitting diode display (OLED) device according to a related art.
Figure 2:
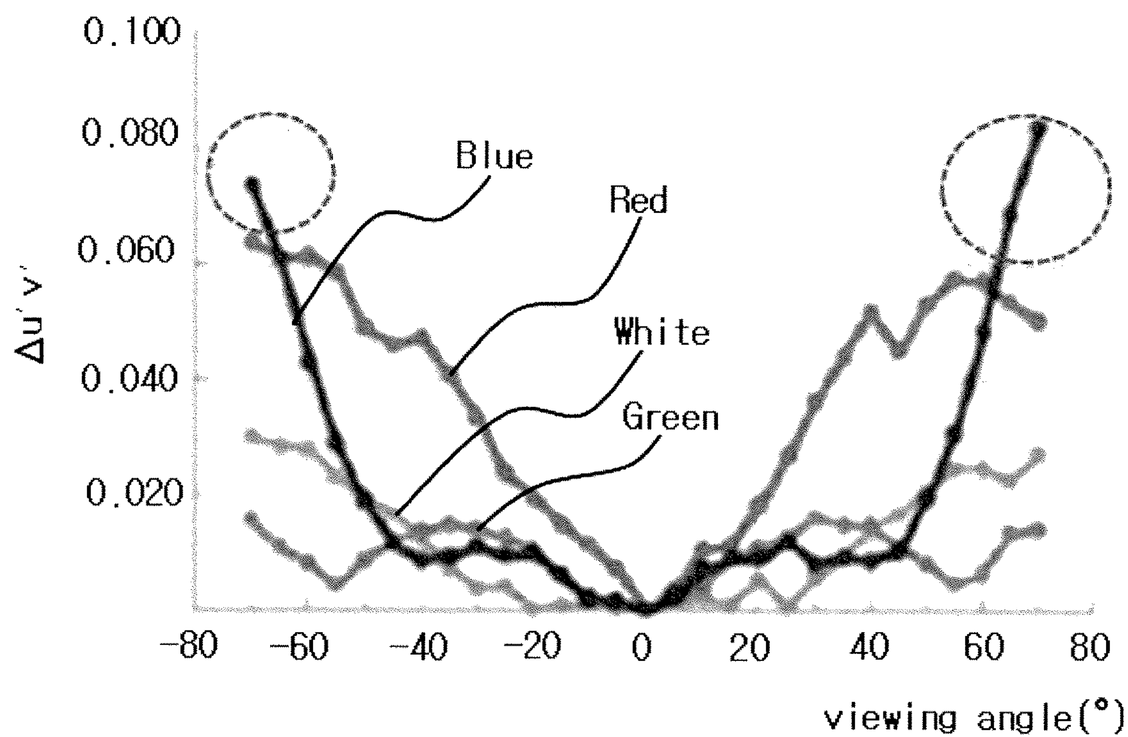
FIG. 2 is a graph showing a luminance distribution according to a viewing angle.

In case of a reflection color rather than a transmission color, the related art polarizer 20 (see FIG. 1) implements a uniform reflection color according to an angle. A change in a reflection color according to an angle is increased due to a phase retardation value for a thickness of the CLC layer 200 (see FIG. 8) added to the polarizer 130.

Accordingly, it can be more preferable to additionally provide a color compensation layer between the CLC layer 200 and the phase retardation plate 133, and the color compensation layer can be a phase retardation compensation layer for a thickness. In an example, the phase delay compensation layer for a thickness can include a C-plate, and in particular, a positive C-plate.

The CLC layer 200 (see FIG. 8) including the liquid crystal molecules 220 (see FIG. 5B) with the discotic shape can be designed to have a phase retardation value for a thickness by adjusting a tilt angle of the liquid crystal molecules 220 (see FIG. 5B) with the discotic shape.

In other words, when the tilt angle of the liquid crystal molecules 220 (see FIG. 5B) with the discotic shape is in a range of 60° to 90°, the CLC layer 200 (see FIG. 8) has an x-axis refractive index (Nx) and a y-axis refractive index (Ny) of 1.5 to 1.7, and a z-axis refractive index (Nz) of 1.6 to 1.8.

A difference between Nx and Ny can be in a value range of 0.05 to 0.2.

Therefore, the CLC layer 200 (see FIG. 8) having the liquid crystal molecules 220 (see FIG. 5B) with the discotic shape can have a phase retardation characteristic of the positive C-plate ($Nx=Ny<Nz$).

Therefore, in the CLC layer 200 (see FIG. 8) having the liquid crystal molecules 220 (see FIG. 5B) with the discotic shape, a phase retardation compensation layer for a thickness can be omitted.

In case of a transmission color, a change in a reflection wavelength according to a viewing angle of the CLC layer 200 (see FIG. 8) having the liquid crystal molecules 220 (see FIG. 5B) with the discotic shape is insensitive as compared to the CLC layer 200 (see FIG. 8) having the liquid crystal molecules with the rod shape, thereby providing a more efficient effect of compensating for a color shift phenomenon according to a viewing angle.

Figure 10:
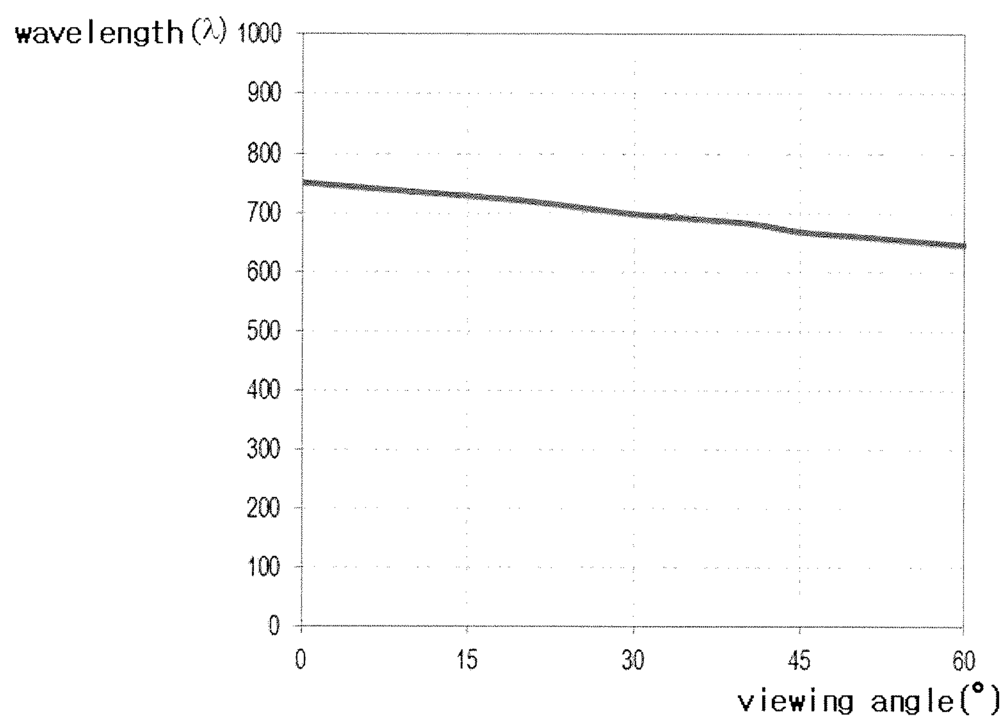
FIG. 10 is a graph showing a reflection wavelength according to a viewing angle of a CLC layer having a wavelength of 750 nm.

FIG. 10 is a graph showing a reflection wavelength according to a viewing angle of a CLC layer having a wavelength of 750 nm. The CLC layer 200 (see FIG. 8) has the liquid crystal molecules 220 (see FIG. 5B) with a discotic shape.

As shown in FIG. 10, in the CLC layer 200 having the wavelength of 750 nm, it can be seen that as a viewing angle is increased, a reflection wavelength region is decreased. In this case, it can be seen that a change in a reflection wavelength is insensitive according to a viewing angle.

This can be more clearly seen with reference to FIGS. 6A and 7A.

In the CLC layer 200 (see FIG. 8) having the liquid crystal molecules 220 (see FIG. 5B) with the discotic shape, a reflection wavelength can be more accurately designed for each color.

Figure 11:
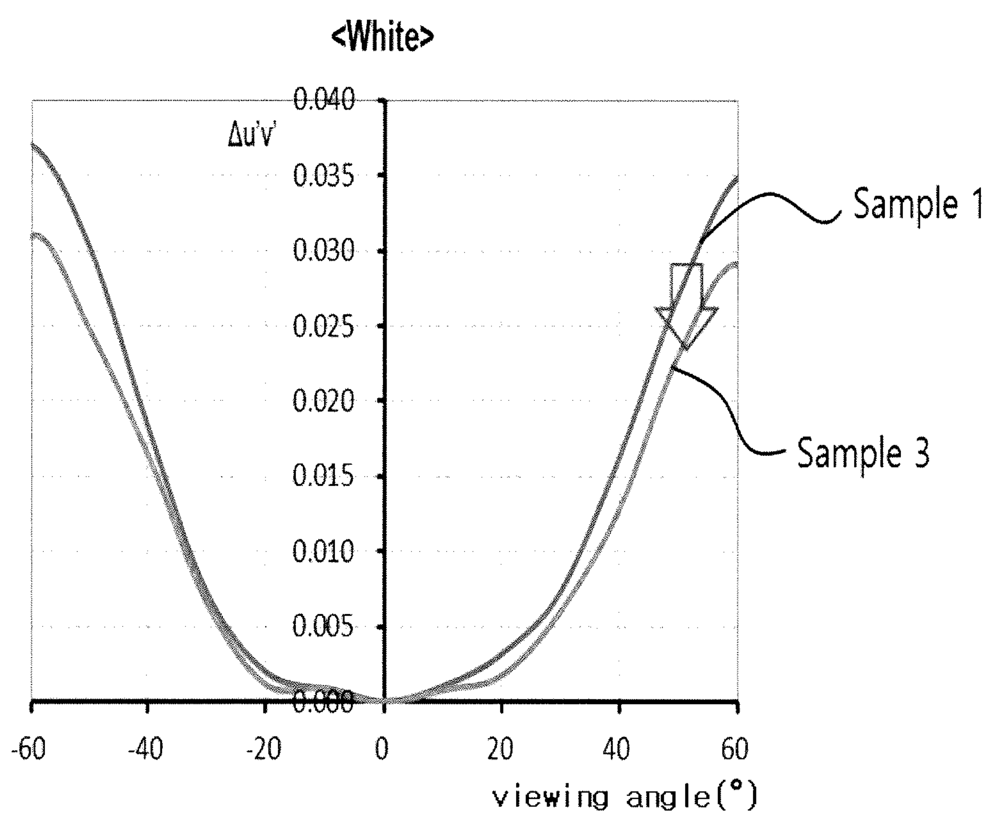
FIG. 11 is a graph showing a comparison between brightness distributions according to a viewing angle for the related art OLED display device and an OLED display device including a CLC layer having liquid crystal molecules in a discotic shape according to an embodiment of the present invention.

FIG. 11 is a graph showing a comparison between brightness distributions according to a viewing angle for the related art OLED display device and the OLED display device including the CLC layer 200 (see FIG. 8) having the liquid crystal molecules 220 (see FIG. 5B) in the discotic shape according to the embodiment of the present invention. Emission intensity of white light was measured. Sample 1 represents the related art OLED display device, and Sample 3 represents the OLED display device including the CLC layer 200 (see FIG. 8) having the liquid crystal molecules 220 (see FIG. 5B) with the discotic shape.

Referring to FIG. 11, it can be seen that a change rate from a white color when viewed from the front is rapidly increased as a viewing angle is changed from 0° to 60°. It can be seen that a change rate in emission intensity of Sample 3 is reduced compared to Sample 1.

In particular, in comparison with FIG. 9, between the CLC layer 200 (see FIG. 8) having the liquid crystal molecules 210 (see FIG. 4B) with the rod shape and the CLC layer 200 (see FIG. 8) having the liquid crystal molecules 220 (see FIG. 5B) with the discotic shape, it can be seen that a change ratio from a color when viewed from the front is not greatly changed according to a viewing angle. This means that the CLC layer 200 (see FIG. 8) having the liquid crystal molecules 210 (see FIG. 4B) with the rod shape and the CLC layer 200 (see FIG. 8) having the liquid crystal molecules 220 (see FIG. 5B) with the discotic shape do not greatly differ in an effect of compensating for a color shift phenomenon in which light is shifted from a long wavelength to a short wavelength according to an increase in a viewing angle.

However, as described above, when the CLC layer 200 (see FIG. 8) has the liquid crystal molecules 220 (see FIG. 5B) with the discotic shape, a change in a reflection wavelength can be insensitive according to a viewing angle, thereby more accurately designing a reflection wavelength according to a viewing angle for each color in the CLC layer 200 (see FIG. 8) having the liquid crystal molecules 220 (see FIG. 5B) with the discotic shape.

As described above, in the OLED display device 100 according to the embodiment of the present invention, since the polarizer 130 is provided on the outer surface of the substrate 101, reflection of external light can be minimized to prevent a reduction in contrast. Since the CLC layer 200 having the IR wavelength is further provided, among light which is output from substrate 101 and which is incident on the CLC layer 200, some light in an IR wavelength region according to the pitch P of the CLC layer 200 passes through the CLC layer 200, and light in a specific wavelength region according to a viewing angle is reflected and recycled.

The recycled light can be output at its original viewing angle in the lateral direction of the OLED display device 100, and thus a color shift phenomenon, in which light is shifted from a long wavelength to a short wavelength according to an increase in a viewing angle, can be compensated through the light output in the lateral direction of the OLED display device 100.

As a result, a bluish appearing phenomenon at a side viewing angle is reduced.

Figure 12A:
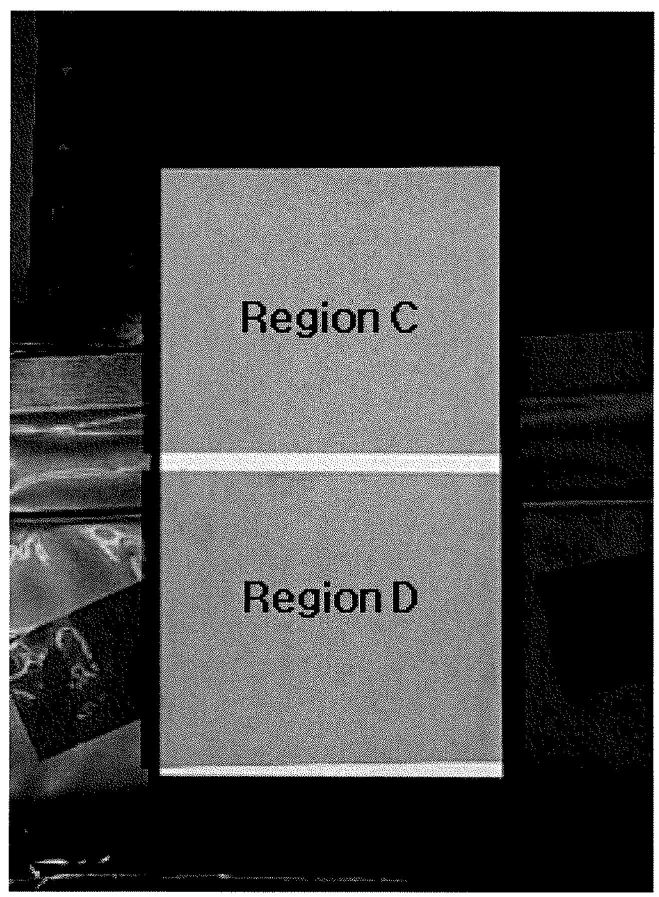
FIG. 12A is an image when viewed from a front of an OLED display device in which a micro cavity effect is implemented.

FIG. 12A is an image when viewed from the front of an OLED display device in which a micro cavity effect is implemented according to an example of the present invention.

Figure 12B:
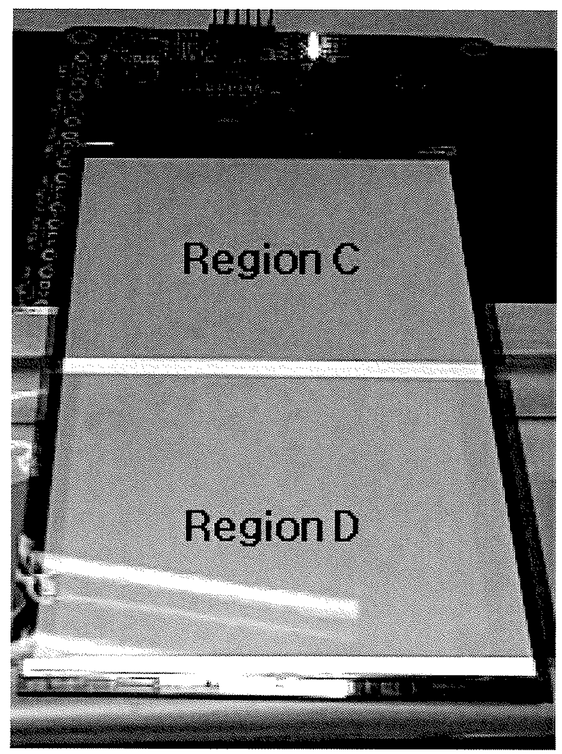
FIG. 12B is an image when viewed from a side of the OLED display device in which a micro cavity effect is implemented.

FIG. 12B is an image when viewed from the side of an OLED display device in which the micro cavity effect is implemented according to an example of the present invention.

Region C is a region which does not include the CLC layer 200 (see FIG. 8), and region D is a region which includes the CLC layer 200 (see FIG. 8) having the liquid crystal molecules 220 (see FIG. 5B) with the discotic shape.

As shown in FIG. 12A, in the OLED display device (100 in FIG. 8) in which the micro cavity effect is implemented, a normal white color is expressed when an image is viewed at a viewing angle of 0°, i.e., from the front thereof regardless of the presence or absence of the CLC layer 200 (see FIG. 8).

On the other hand, as shown in FIG. 12B, when an image is viewed from the side, it can be seen that a bluish appearing phenomenon occurs in region C in which the CLC layer 200 (see FIG. 8) does not exist, but the bluish appearing phenomenon is reduced in region D including the CLC layer 200 (see FIG. 8).

In other words, the OLED display device 100 (see FIG. 8) can further include the CLC layer 200 (see FIG. 8) having an IR reflection wavelength, and thus a color shift phenomenon, in which light is shifted from a long wavelength to a short wavelength according to an increase in a viewing angle, can be compensated through light output in the lateral direction of the OLED display device 100. As a result, a bluish appearing phenomenon at a side viewing angle is reduced.

As described above, according to the embodiments of the present invention, since a CLC layer having an IR wavelength is disposed on an outer surface of a substrate through which light of an OLED display device passes, among light which is output from the substrate and is incident on the CLC layer, some light in an IR wavelength region according to a pitch of the CLC layer passes through the CLC layer, and light in a specific wavelength region according to a viewing angle is reflected and recycled.

Thus, a color shift phenomenon, in which light is shifted from a long wavelength to a short wavelength according to an increase in a viewing angle, can be compensated through light output in the lateral direction of the OLED display device. Therefore, a bluish appearing phenomenon at a side viewing angle is reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:

a substrate including a red pixel region, a green pixel region, and a blue pixel region;

a driving thin film transistor, a first electrode, and a light emitting diode each of which are provided in each of the red pixel region, the green pixel region, and the blue pixel region;

a second electrode common to each of the red, green, and blue pixel regions; and a cholesteric liquid crystal (CLC) layer having an infrared radiation (IR) wavelength in a transmission direction of light emitted from the light emitting diodes, wherein the IR wavelength is in a range of approximately 800 nm to 1,100 nm, and the CLC layer has a reflection wavelength of approximately 400 nm to 700 nm at a viewing angle of approximately 40° to 60°, wherein the light emitting diode in the red pixel region has a first thickness, wherein the light emitting diode in the green pixel region has a second thickness, wherein the light emitting diode in the blue pixel region has a third thickness, wherein the first to third thicknesses are different from one another, wherein each of the first to third thicknesses is a distance between the first electrode of the red, green, and blue pixel regions respectively and the second electrode of the light emitting diode in each of the red, green and blue pixel regions, and wherein each first electrode is formed to have different thicknesses which differ for each of the red, green, and blue pixel regions.

2. The organic light emitting diode display device of claim 1, wherein when the IR wavelength of the CLC layer is 800 nm, the CLC layer has a reflection wavelength of 400 nm at a viewing angle of 60°.

3. The organic light emitting diode display device of claim 1, wherein when the IR wavelength of the CLC layer is 1,100 nm, the CLC layer has a reflection wavelength of 580 nm at a viewing angle of 60°.

4. The organic light emitting diode display device of claim 1, wherein the CLC layer is between the light emitting diodes and a λ/4 phase retardation plate, and wherein a linear polarizing plate is on the λ/4 phase retardation plate.

5. The organic light emitting diode display device of claim 4, wherein the CLC layer includes liquid crystal molecules of a rod shape, and wherein a color compensation layer is provided between the CLC layer and the λ/4 phase retardation plate.

6. The organic light emitting diode display device of claim 4, wherein the CLC layer has a spiral structure in which an orientation direction of liquid crystal molecules of a discotic shape is changed along an axis.

7. The organic light emitting diode display device of claim 1, wherein the driving thin film transistors include a semiconductor layer, a gate insulating layer on the semiconductor layer, a gate electrode on the gate insulating layer, a first interlayer insulating layer on the gate electrode, and a source electrode and a drain electrode on the first interlayer insulating layer, and wherein the light emitting diodes are on a second interlayer insulating layer that is on the source electrode and the drain electrode, and includes the first electrode connected to the driving thin film transistor transistors, an organic light emitting layer on the first electrode, and the second electrode on the organic light emitting layer.

8. The organic light emitting diode display device of claim 1, further comprising:

a protective film configured to cover the driving thin film transistors and the light emitting diodes.

9. The organic light emitting diode display device of claim 1, wherein the CLC layer serves to recycle light in a range from a green wavelength region to a red wavelength region and outputs the recycled light in a lateral direction of the organic light emitting diode display device.

10. The organic light emitting diode display device of claim 1, wherein the first electrode in the red pixel region has a fourth thickness, the first electrode in the green pixel region has a fifth thickness less than the fourth thickness, and the first electrode in the blue pixel region has a sixth thickness less than the fifth thickness.

* * * * *